United States Patent
Williams et al.

(10) Patent No.: US 11,057,006 B2
(45) Date of Patent: Jul. 6, 2021

(54) SYSTEMS AND METHODS FOR FULL DUPLEX AMPLIFICATION

(71) Applicant: CABLE TELEVISION LABORATORIES, INC, Louisville, CO (US)

(72) Inventors: Thomas Holtzman Williams, Longmont, CO (US); Belal Hamzeh, Westminster, CO (US)

(73) Assignee: Cable Television Laboratories, Inc., Louisville, CO (US)

( * ) Notice: Subject to any disclaimer, the term of this patent is extended or adjusted under 35 U.S.C. 154(b) by 0 days.

(21) Appl. No.: 16/876,321

(22) Filed: May 18, 2020

(65) Prior Publication Data

US 2020/0280289 A1 Sep. 3, 2020

Related U.S. Application Data

(63) Continuation of application No. 16/663,100, filed on Oct. 24, 2019, now Pat. No. 10,658,989, which is a continuation-in-part of application No. 16/177,428, filed on Nov. 1, 2018, now Pat. No. 10,491,361.

(60) Provisional application No. 62/579,648, filed on Oct. 31, 2017, provisional application No. 62/749,774, filed on Oct. 24, 2018.

(51) Int. Cl.
| | |
|---|---|
| *H04L 5/14* | (2006.01) |
| *H03F 3/189* | (2006.01) |
| *H03F 3/68* | (2006.01) |
| *H04L 12/28* | (2006.01) |
| *H03F 3/62* | (2006.01) |

(52) U.S. Cl.
CPC ............... *H03F 3/189* (2013.01); *H03F 3/62* (2013.01); *H03F 3/68* (2013.01); *H04L 5/14* (2013.01); *H04L 12/2801* (2013.01); *H03F 2200/111* (2013.01); *H03F 2200/451* (2013.01)

(58) Field of Classification Search
CPC ... H03F 3/189; H03F 3/62; H03F 3/68; H04L 5/14; H04L 12/2801
See application file for complete search history.

(56) References Cited

U.S. PATENT DOCUMENTS

| | | | | |
|---|---|---|---|---|
| 8,755,399 | B1* | 6/2014 | Van Buren | H04B 7/15535 370/430 |
| 9,906,193 | B2* | 2/2018 | Hellberg | H03F 3/602 |
| 2002/0116720 | A1* | 8/2002 | Terry | H04L 12/2872 725/118 |
| 2006/0048203 | A1* | 3/2006 | Mensing | H04L 12/2801 725/123 |
| 2013/0125182 | A1* | 5/2013 | Bowler | H04L 27/0006 725/105 |
| 2013/0135043 | A1* | 5/2013 | Hietala | H03F 3/72 330/124 R |
| 2018/0020256 | A1* | 1/2018 | Ibelings | H04N 21/435 |

* cited by examiner

*Primary Examiner* — Jaison Joseph

(74) *Attorney, Agent, or Firm* — PdZ Patent Law, PLLC

(57) ABSTRACT

An amplification subsystem for a communication system includes a downstream amplifier configured to transmit a downstream signal within a first frequency range, an upstream amplifier configured to transmit an upstream signal within a second frequency range, and a bidirectional amplifier configured to selectively transmit a mid-band signal in either of the upstream and downstream direction.

20 Claims, 10 Drawing Sheets

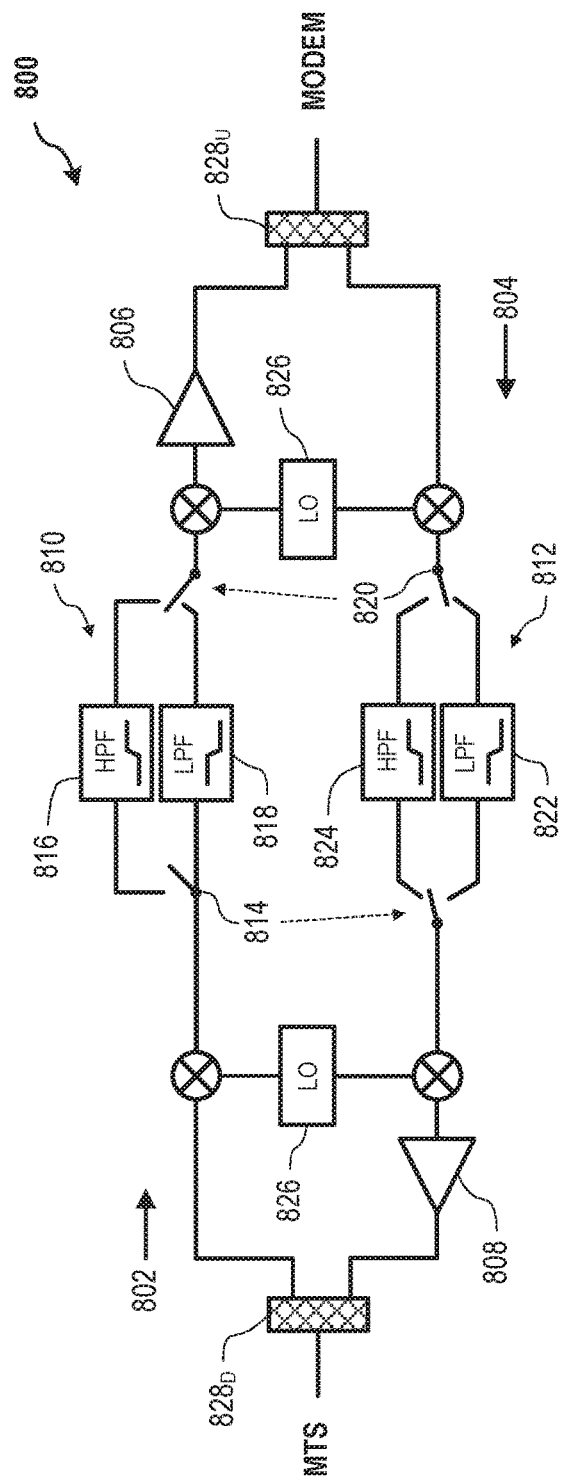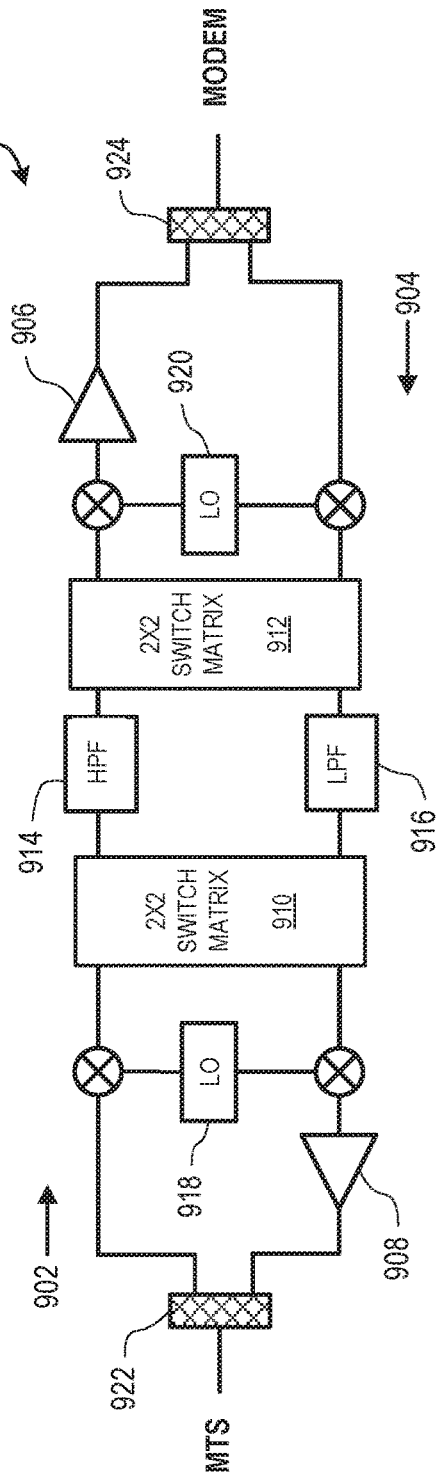

SYSTEMS AND METHODS FOR FULL DUPLEX AMPLIFICATION

CROSS REFERENCE TO RELATED APPLICATIONS

This application is a continuation of U.S. patent application Ser. No. 16/663,100, filed Oct. 24, 2019, which application is a continuation in part of U.S. patent application Ser. No. 16/177,428, filed Nov. 1, 2018, now U.S. Pat. No. 10,491,361, issued Nov. 26, 2019, which prior application claims the benefit of and priority to U.S. Provisional Patent Application Ser. No. 62/579,648, filed Oct. 31, 2017. This application additionally claims the benefit of and priority to U.S. Provisional Patent Application Ser. No. 62/749,774, filed Oct. 24, 2018. The disclosures of all of these applications are incorporated herein by reference in their entireties.

BACKGROUND

The field of the disclosure relates generally communication networks, and more particularly, to communication networks implementing full duplex transmission.

A duplex communication system is a point-to-point (P2P) system composed of two connected parties or devices that can communicate with one another in both directions. Generally, a duplex system has two clearly defined data transmission channels, with each channel carrying information in one direction, i.e., upstream or downstream. In a full duplex system, both parties/devices can communicate with each other simultaneously using the same physical spectrum channels. That is, information travels simultaneously in both the upstream and downstream directions of a single transmission medium (e.g., fiber optic, cable, etc.).

In a cable network that transmits radio frequency (RF) signals, full duplex communication has been difficult to achieve due to the number of downstream devices, as well as the network configuration. For example, a modem termination system (MTS, or a cable MTS (CMTS)) is typically coupled to a plurality of downstream modems (including cable modems (CMs)). Each of the modems transmits upstream along the same path to the MTS, while the MTS transmits its downstream communications to the modem(s). The modems and the MTS though, generally utilize different spectral bands from one another, and the modems may transmit at specific coordinated times.

In typical operation, however, many modems transmit to the MTS at the same time, and thus tend to interfere with one another, and also with the MTS if they are not separated in time and spectrum bands, as required by conventional Frequency Division Duplex (FDD), Time Division Multiple Access (TDMA), and Time Division Duplex (TDD) techniques. Full duplex has been implemented in access networks utilizing hybrid fiber-coaxial (HFC) and/or radio frequency over glass (RFoG) architectures, but is not limited to only these types of communication systems.

Systems and methods for full duplex transmission are illustrated and described in greater detail in U.S. Pat. No. 9,762,377, which is incorporated by reference herein. As described in this earlier patent, full duplex is accomplished for a communication system in an RF cable network utilizing a CMTS of a headend/hub in operable communication with a plurality of CMs (e.g., through a node) over a duplex communication link, which may include a fiber optic transmission medium, and implementing a communication protocol such as Data Over Cable Service Interface Specification (DOCSIS). Under these configurations, the CMTS is operable to send control signals that direct the CMs to operate in a particular manner with respect to the employed cable protocol.

Amplification of full duplex transmissions, however, has been challenging. Conventional amplifiers used in HFC networks, for example, are designed to amplify distinct non-overlapping portions of the transmitted spectrum in either direction. In one example, a mid-split amplifier amplifies a 5-85 MHz spectral portion in the upstream direction, and a 108-1218 MHz spectral portion in the downstream direction. However, a full duplex should be capable a full duplex portion of the spectrum (e.g., 108-684 MHz) in both directions. One particular challenge associated with amplifying this common spectrum in both directions is the susceptibility of the amplifier to the ringing effect or amplifier instability. Instability resulting from a bleed-over effect between the downstream and upstream transmissions is described further below with respect to FIGS. 1-3.

FIG. 1 is a schematic illustration of an apportioned frequency spectrum 100 for dual-direction transmission in a communication system. Frequency spectrum 100 includes a first spectral portion 102 designated for signals transmitted in the downstream direction (e.g., from the hub/headend MTS to one or more modems), and a second spectral portion 104 designated for signals transmitted in the upstream direction (e.g., from a modem to the MTS). First spectral portion 102 is a separated from second spectral portion 104 about a center frequency $f_c$ between the respective portions. In this example, first spectral portion 102 is depicted as spanning the range between 85 MHz and 1002 MHz, whereas second spectral portion 104 is depicted as spanning the range between 5 MHz and 75 MHz. These spectral ranges though, are provided for illustrative purposes, and are not intended to be limiting. That is, different spectral ranges may be utilized in the upstream and downstream directions without departing from the scope of the systems and methods described herein.

FIG. 2 is a schematic illustration depicting a sequential amplifier bleed-over effect 200 from a downstream transmission 202 onto an upstream transmission 204 using an amplification subsystem 206 in a conventional duplex communication system. Amplification subsystem 206 includes a downstream amplifier 208, an upstream amplifier 210, a first splitter/combiner 212 (e.g., disposed between amplification subsystem 206 and the MTS), and a second splitter/combiner 214 (e.g., disposed between amplification subsystem 206 and one or more modems).

In operation (i.e., sequence steps $I_D$-$VI_D$), downstream transmission 202 is initially received from the MTS by first splitter/combiner 212, and is substantially confined within first spectral portion $102_D(I)$. For ease of explanation, the MTS is presumed, for purposes of this discussion, to transmit no downstream signal within second spectral portion 104. That is, at sequence step $I_D$, second spectral portion $104(I_D)$ is a substantially equal to zero. As described below with respect to FIG. 3, however, some portion of upstream transmission 204 will be seen (i.e., bleed over) at first splitter/combiner 212. Accordingly, even though both downstream transmission 202 and upstream transmission 204 affect each other, the description of the embodiments of FIGS. 2 and 3 addresses each respective effect individually, for ease of explanation.

In further operation of amplification subsystem 206, at sequence step $II_D$, downstream transmission 202 is amplified by downstream amplifier 208, as symbolically indicated by the increased amplitude of first spectral portion $102(II_D)$ (i.e., after passing through downstream amplifier 208) with respect to first spectral portion 102($I_D$). In this example, downstream amplifier 208 is depicted as having a 25 dB gain, but this gain value is provided merely for purposes of illustration, and not in a limiting sense. Thus, ideally, second splitter/combiner 214 would ideally receive and transmit to one or more modems a "clean" amplified downstream transmission 202 conforming to the illustrated shape of first spectral portion 102($II_D$).

However, at sequence step $III_D$, some of downstream transmission 202 will bleed over into upstream transmission 204 proximate second splitter/combiner 214, as indicated by first spectral portion 102($III_D$). At the same time, at sequence step $IV_D$, second splitter/combiner 214 receives upstream transmission 204 from one or more modems second substantially confined within and second spectral portion 104 ($IV_D$). Accordingly, as seen at the input to upstream amplifier 210, the spectral representation of upstream transmission 204 at sequence step $V_D$ resembles the combination of the spectral representation of upstream transmission 204 at sequence step $IV_D$ (i.e., second spectral portion 104($IV_D$)) and the spectral representation of the bleed-over of downstream transmission 202 at sequence step $III_D$ (i.e., first spectral portion 102($III_D$)). At sequence step $VI_D$, the entirety of the input spectrum (i.e., first spectral portion 102($V_D$) and second spectral portion 104($V_D$)) at sequence step $V_D$ is amplified by upstream amplifier 210. Accordingly, at sequence step $VI_D$, the MTS will receive a substantially amplified, but undesirable, second spectral portion 104($VI_D$).

FIG. 3 is a schematic illustration depicting a sequential amplifier bleed-over effect 300 from upstream transmission 204, FIG. 2, onto downstream transmission 202 using amplification subsystem 206. Bleed-over effect 300 is similar to bleed-over effect 200, except that bleed-over effect 300 is individually described with respect to sequence steps $I_U$-$VI_U$) that illustrate the respective effect on downstream transmission 202 from upstream transmission 204. The person of ordinary skill in the art will appreciate that both of bleed-over effects 200, 300 may occur simultaneously, and even cause a magnification of the respective effect over time.

In operation of amplification subsystem 206 (i.e., from the upstream perspective), at sequence step $I_U$, upstream amplifier 210 receives a "clean" (for purposes of this discussion) upstream transmission 204 substantially confined within second spectral portion 104($I_U$). At sequence step $II_U$, upstream amplifier 210 amplifies (e.g., a 25 dB gain, in this example) upstream transmission 204 to produce an output having the profile of second spectral portion 104($II_U$), which spans the same frequency range as second spectral portion 104($I_U$), but has a greater amplitude.

Similar to bleed-over effect 200, at sequence step $III_U$, some of upstream transmission 204 will bleed over into downstream transmission 202 proximate first splitter/combiner 212, as indicated by second spectral portion 104($III_U$). At the same time, at sequence step $IV_U$, first splitter/combiner 212 receives downstream transmission 202 from the MTS, which is substantially confined within second spectral portion 102($IV_U$). Accordingly, as seen at the input to downstream amplifier 208, the spectral representation of downstream transmission 202 at sequence step $V_U$ resembles the combination of the spectral representation of downstream transmission 202 at sequence step $IV_U$ (i.e., first spectral portion 102($IV_U$)) and the spectral representation of the bleed-over of upstream transmission 204 at sequence step $III_U$ (i.e., second spectral portion 104($III_U$)). At sequence step $VI_U$, the entirety of the input spectrum (i.e., first spectral portion 102($V_U$) and second spectral portion 104($V_U$)) at sequence step $V_U$ is amplified by downstream amplifier 208. Accordingly, at sequence step $VI_U$, the modem(s) will receive a substantially amplified, but undesirable, first spectral portion 102($VI_U$).

The person of ordinary skill in the art will thus understand how, in conventional configurations, the undesirable bleed-over portions can continue to cycle back and forth between downstream transmission 202 and upstream transmission 204 and be continually amplified in each cycle and destabilize the respective transmissions thereby. Accordingly, it is desirable to provide an amplifier system or technique for full duplex transmissions that avoids the instability, bleed-over, and ringing problems that are conventionally encountered.

BRIEF SUMMARY

In an embodiment, an amplification subsystem for a communication system includes a downstream amplifier configured to transmit a downstream signal within a first frequency range, an upstream amplifier configured to transmit an upstream signal within a second frequency range, and a bidirectional amplifier configured to selectively transmit a mid-band signal in either of the upstream and downstream direction.

In an embodiment, an amplification subsystem for a communication system, includes a downstream amplifier configured to transmit a downstream signal within a first frequency range, an upstream amplifier in parallel with the downstream amplifier and configured to transmit an upstream signal within a second frequency range lower than the first frequency range, and a bidirectional amplifier in parallel with the downstream and upstream amplifiers and configured to selectively transmit a mid-band signal in either of the upstream and downstream direction. The mid-band signal includes a third frequency range between the first and second frequency ranges.

In an embodiment, a bidirectional amplification subsystem for a full duplex communication system includes a first amplifier configured to transmit a first signal in a first direction along a transmission channel of the communication system within a first frequency range, a second amplifier in parallel with the first amplifier and configured to transmit a second signal along the transmission channel in a second direction opposite the first direction and within a second frequency range lower than the first frequency range, and a third amplifier in parallel with the first and second amplifiers and configured to selectively transmit a third signal along the transmission channel in the first or second directions. The third signal occupies a third frequency range between the first and second frequency ranges.

In an embodiment, an amplification subsystem is provided for a communication system having a first transceiver in communication with a second transceiver over a transmission medium. The amplification subsystem includes a first amplifier configured to transmit a first signal from the first transceiver to the second transceiver within a first frequency range, a second amplifier configured to transmit a second signal from the second transceiver to the first transceiver within a second frequency range different from the first frequency range, a first diplexer disposed along the transmission medium between the first transceiver and the first amplifier, and a second diplexer disposed along the transmission medium between the second transceiver and the second amplifier. The amplification subsystem further includes a first bypass circuit in parallel with the first diplexer, and a second bypass circuit in parallel with the second diplexer. The first bypass circuit includes a first switched bandpass filter configured to transmit the first signal within a third frequency range between the first and second frequency ranges, and the second bypass circuit includes a second switched bandpass filter configured to transmit the second signal within the third frequency range.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein:

FIG. 8 is a schematic illustration of a full duplex amplification subsystem for a communication system, in accordance with an embodiment.

FIG. 9 is a schematic illustration of a full duplex amplification subsystem for a communication system, in accordance with an alternative embodiment.

Figure 1:
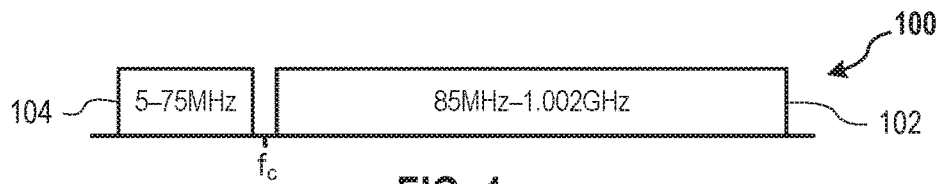
FIG. 1 is a graphical illustration of an apportioned frequency spectrum for dual-direction transmission in a communication system.

Unless otherwise indicated, the drawings provided herein are meant to illustrate features of embodiments of this disclosure. These features are believed to be applicable in a wide variety of systems including one or more embodiments of this disclosure. As such, the drawings are not meant to include all conventional features known by those of ordinary skill in the art to be required for the practice of the embodiments disclosed herein.

DETAILED DESCRIPTION

In the following specification and claims, reference will be made to a number of terms, which shall be defined to have the following meanings.

The singular forms "a," "an," and "the" include plural references unless the context clearly dictates otherwise.

"Optional" or "optionally" means that the subsequently described event or circumstance may or may not occur, and that the description includes instances where the event occurs and instances where it does not.

As used herein, the term "database" may refer to either a body of data, a relational database management system (RDBMS), or to both, and may include a collection of data including hierarchical databases, relational databases, flat file databases, object-relational databases, object oriented databases, and/or another structured collection of records or data that is stored in a computer system.

Furthermore, as used herein, the term "real-time" refers to at least one of the time of occurrence of the associated events, the time of measurement and collection of predetermined data, the time for a computing device (e.g., a processor) to process the data, and the time of a system response to the events and the environment. In the embodiments described herein, these activities and events occur substantially instantaneously.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

The embodiments described herein provide innovative systems and methods for enabling stable and reliable amplification of full duplex transmissions over communication networks. The present systems and methods are particularly useful with respect to active HFC networks implementing DOCSIS protocols, but also useful with respect to one or more of the other types of communication networks and protocols described herein, whether taken alone, or in various combinations/sub-combinations within a cooperative network architecture.

In an exemplary embodiment, the present systems and methods enable full duplex DOCSIS transmission over active HFC plants by: (1) providing one or more full duplex amplifiers; and (2) establishing interference groups at the MTS. For purposes of this discussion, a "full duplex amplifier" generally refers to an RF amplifier, or amplifier subsystem, capable of amplifying spectral portions of the full duplex spectrum (e.g., frequency spectrum 100, FIG. 1) in the respective upstream and downstream directions. In some embodiments, the full duplex amplifier is further capable of amplifying mid-portions of the full duplex band in either direction, but in the direction that is desired for that particular mid-band portion. Interference groups, on the other hand, are established at the MTS in a manner amenable to an active HFC network in the presence of a full-duplex amplifier.

In an exemplary embodiment, an amplifier architecture may include two full-band amplifiers (e.g., upstream and downstream, respectively), with high isolation capability at the splitter/combiner disposed between the amplifier and the respective MTS or modem. In this embodiment, the full loop gain of an amplifier subsystem is set to be less than 1 (or zero) dB in order to reliably maintain stability. In another exemplary embodiment, an amplifier architecture may include two full-band amplifiers, alternatively (or in a complementary fashion) utilize filters and up/down conversion circuitry to extract a local oscillator (LO) signal from LO on the line.

In an embodiment, interference groups (IG) may be established through group classification at the MTS (or node). For example, the full duplex specification leverages the identification of IGs to minimize the interference between modems using the full duplex spectrum in the upstream direction, and modems using the full duplex spectrum in the downstream direction. IGs may be identified using the sounding mechanism defined in the full duplex specification, and a single N+0 strand, for example, may have multiple IGs (e.g., an N+0 strand having 6 taps may utilize the first and second of such taps each as an independent IG, the third and fourth taps combined into a single IG, and the fifth and sixth taps also combined into a single IG, for a total of four IGs, with the number of IGs being related to the N+0 strand design and the decision criteria at the node/MTS).

With respect to full duplex operation on active nodes, each N+x strand may be defined as a single IG. That is, a node supporting multiple N+1 strands would combine at least two strands into a single serving group, with each strand is configured at the node/MTS to be a single IG. In this example, the node/MTS may advantageously avoid the sounding process, and establish the IGs based on the strand to which the modem is connected (e.g., by knowing the physical address of the modem, or knowing which amplifier within the node is sending/receiving signals from the modem).

Accordingly, the present systems and methods advantageously achieve stable and reliable amplification of a full duplex transmissions (e.g., DOCSIS) on active networks through innovative amplifier design, improved techniques for assigning IGs on strands, and/or a combination thereof. The present systems and methods are described further below with respect to FIGS. 4-10.

Figure 2:
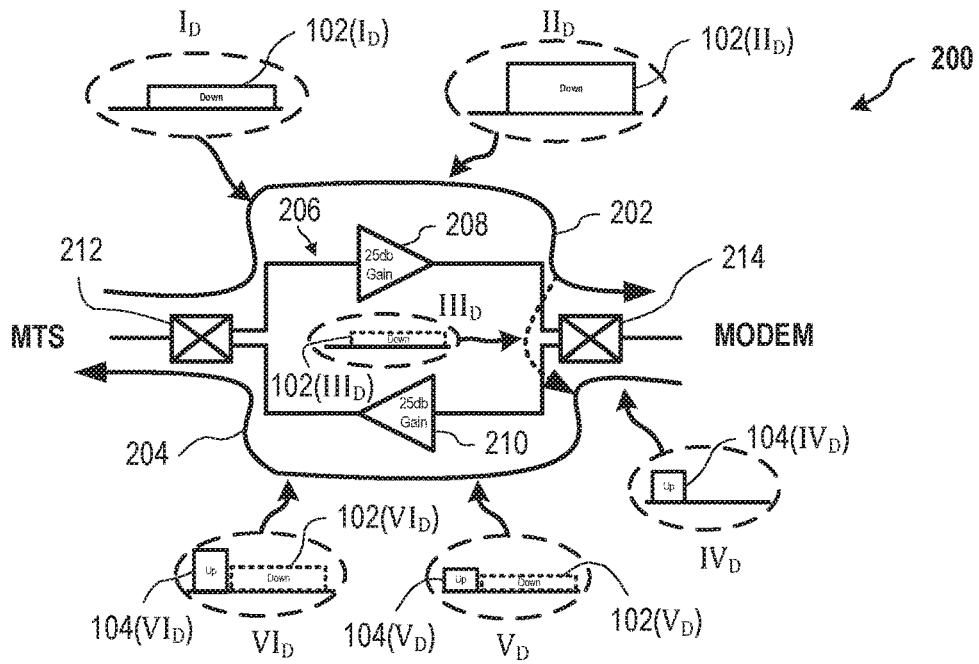
FIG. 2 is a schematic illustration depicting a sequential amplifier bleed-over effect from a downstream transmission onto an upstream transmission using an amplification subsystem in a conventional duplex communication system.
Figure 3:
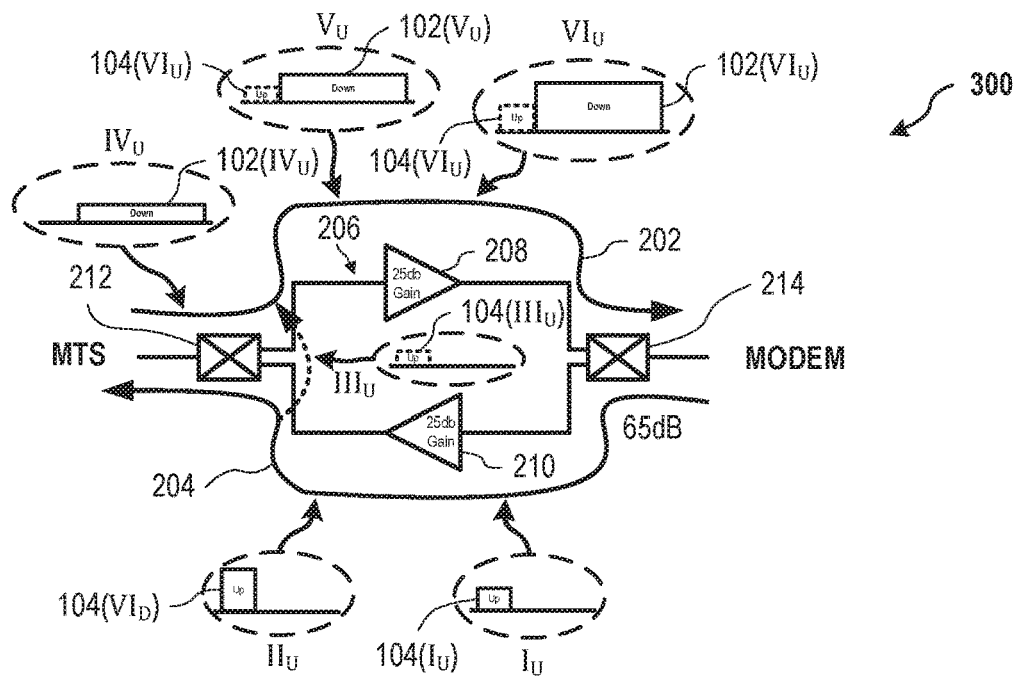
FIG. 3 is a schematic illustration depicting a sequential amplifier bleed-over effect from an upstream transmission onto a downstream transmission using the amplification subsystem depicted in FIG. 2.
Figure 4:
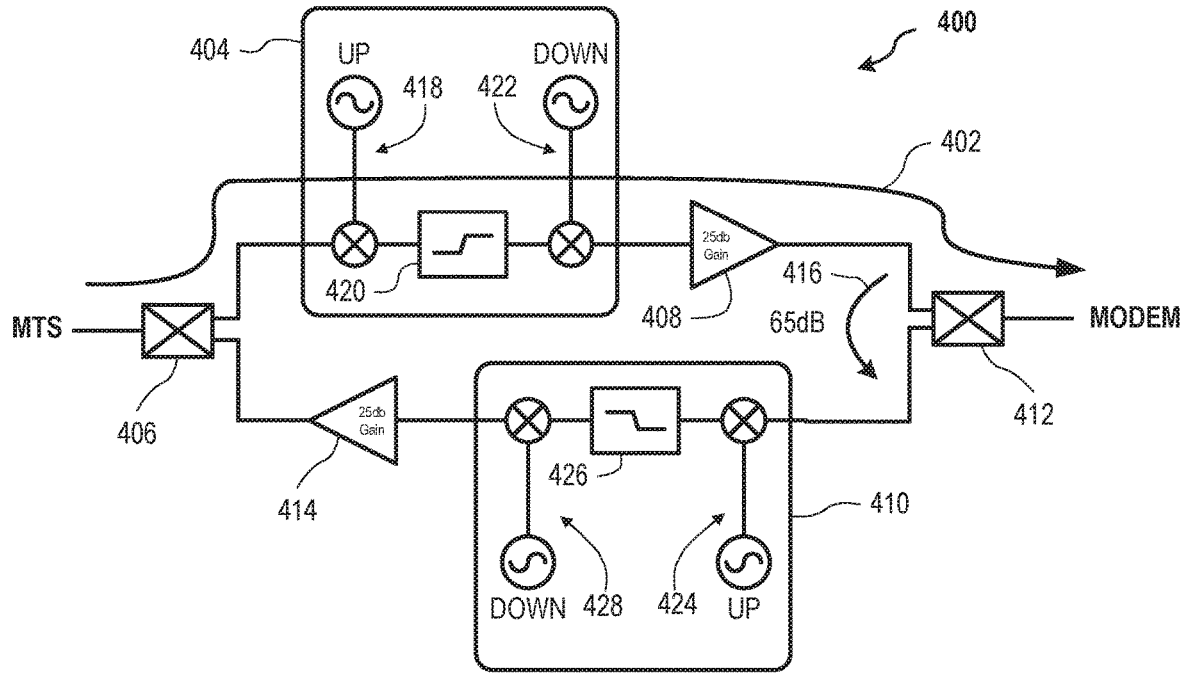
FIG. 4 is a schematic illustration of a full duplex amplification subsystem for amplifying a downstream transmission, in accordance with an embodiment.
Figure 5:
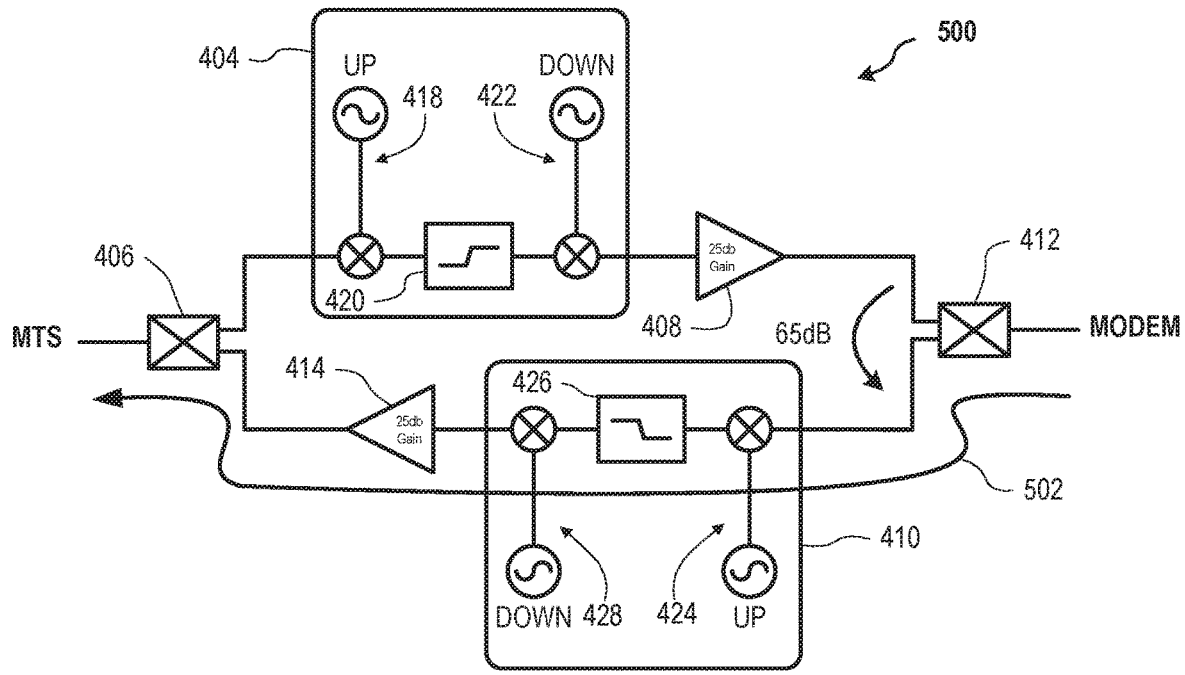
FIG. 5 is a schematic illustration of the full duplex amplification subsystem depicted in FIG. 4, for amplifying an upstream transmission, in accordance with an embodiment.

FIG. 4 is a schematic illustration of a full duplex amplification subsystem 400 for amplifying a downstream transmission 402. FIG. 5 is a schematic illustration of full duplex amplification subsystem 400 for amplifying an upstream transmission 502. Amplification subsystem 400 is similar to amplification subsystem 206, FIG. 2, except that amplification subsystem 400 includes a downstream conversion unit 404 disposed between a first splitter/combiner 406 and a downstream amplifier 408 (e.g., 25 dB), and an upstream conversion unit 410 disposed between a second splitter/combiner 412 and an upstream amplifier 414. In an exemplary embodiment, amplification subsystem 400 further includes an RF isolation 416 (e.g., 65 dB) between the upstream and downstream paths.

Downstream conversion unit 404 includes a downstream up-converter 418, a downstream filter 420, and a downstream down-converter 422. Upstream conversion unit 410 includes an upstream up-converter 424, and upstream filter 426, and an upstream down-converter 428. An exemplary operation of amplification subsystem 400 is described below with respect to FIGS. 6 and 7.

Figure 6:
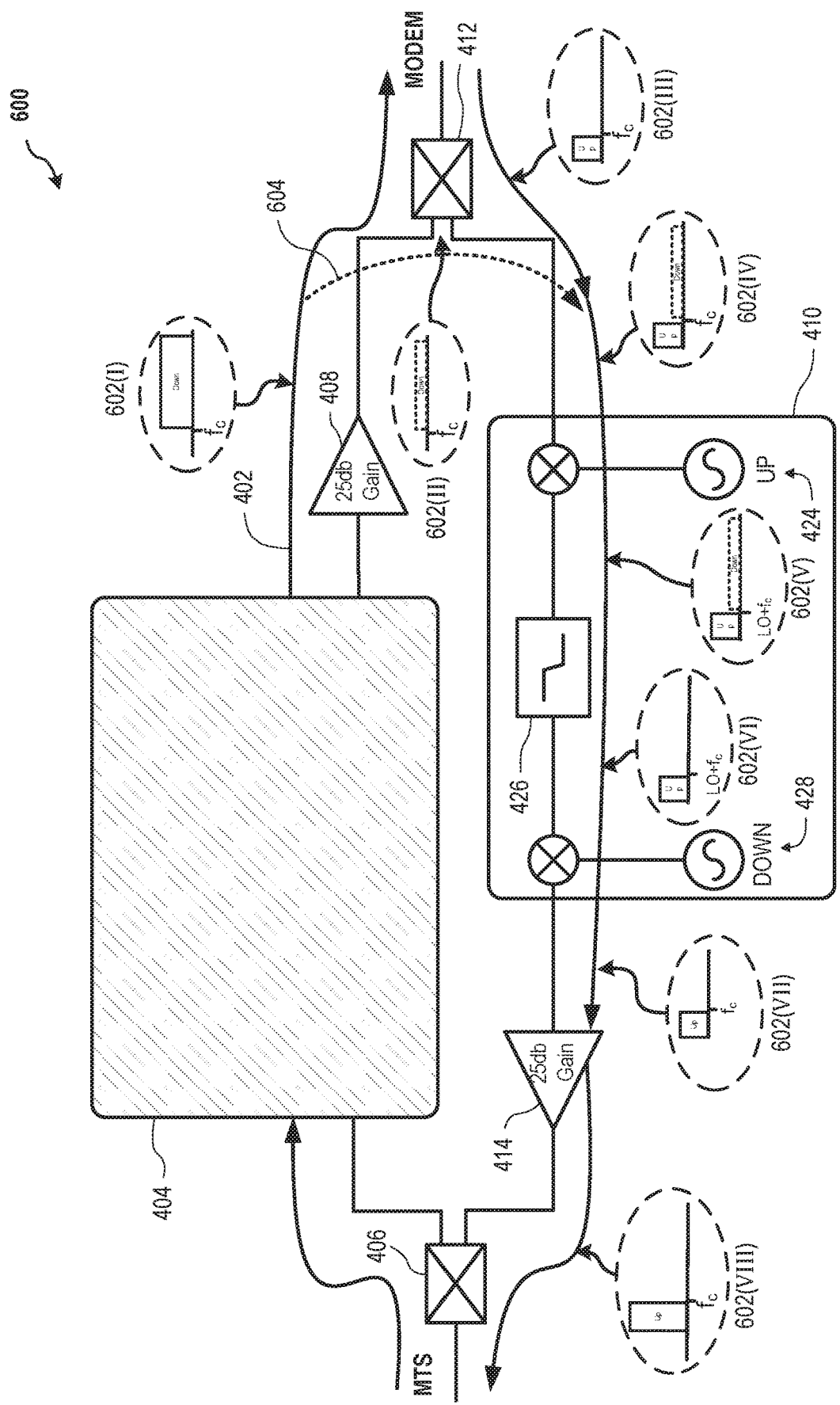
FIG. 6 is a schematic illustration depicting a sequential amplifier bleed-over attenuation effect from the downstream transmission depicted in FIG. 4 onto the upstream transmission depicted in FIG. 5, implementing the full duplex amplification subsystem depicted in FIGS. 4 and 5.

FIG. 6 is a schematic illustration depicting a sequential amplifier bleed-over attenuation effect 600 from downstream transmission 402, FIG. 4, onto upstream transmission 502, FIG. 5, implementing full duplex amplification subsystem 400. Exemplary operation of attenuation effect 600 is described with respect to sequence steps 602 executed with respect to a bleed-over 604 from downstream transmission 402 onto upstream transmission 502.

At sequence step 602(I), an amplified downstream signal (e.g., first spectral portion 102, FIG. 1, after passing through downstream amplifier 408) is output from downstream conversion unit 404 for transmission to one or more modems. However, at sequence step 602(11), bleed-over 604 causes a portion of the downstream signal to bleed over onto upstream transmission 502 proximate second splitter/combiner 412. At the same time, at sequence step 602(111), an upstream signal (e.g., second spectral portion 104, FIG. 1) is also received at second splitter/combiner 412, thereby forming, at sequence step 602(IV), a combined signal at the input of upstream conversion unit 410 that includes the desired upstream spectral portion from the modem and the undesired bleed-over downstream spectral portion.

At sequence step 602(V), upstream up-converter 424 is configured to extract the LO from the input upstream transmission 502, and then shift the center frequency $f_c$ of the full duplex transmission to a higher frequency (i.e., step up) such that an up-converted center frequency $f_c'$ that is input to upstream filter 426 is centered at a frequency corresponding to the LO plus the original center frequency $f_c$ of the full duplex transmission spectrum. By this operation, the full duplex transmission spectrum may be converted to a frequency spectrum outside of the frequency spectrum typically processed within the DOCSIS domain. Within this outside frequency spectrum, upstream filter 426 may then be set to filter out the undesired downstream bleed-over portion of up-converted upstream transmission 502 prior to amplification by upstream amplifier 414.

In the exemplary embodiment, at sequence step 602(VI), upstream filter 426 is configured to filter out (e.g., a low pass filter (LPF)) the downstream portion of the signal that is in a higher spectral band than the upstream portion, and only the upstream portion of the up-converted upstream transmission 502 is provided to upstream down-converter 428 to shift back to the original full duplex center frequency. At sequence step 602(VII), upstream transmission 502 inputs a "clean" upstream signal (e.g., second spectral portion 104, FIG. 1) to upstream amplifier 414. At sequence step 602

(VIII), a "clean" amplified upstream signal is provided to first splitter/combiner 406 for reception by the MTS.

Figure 7:
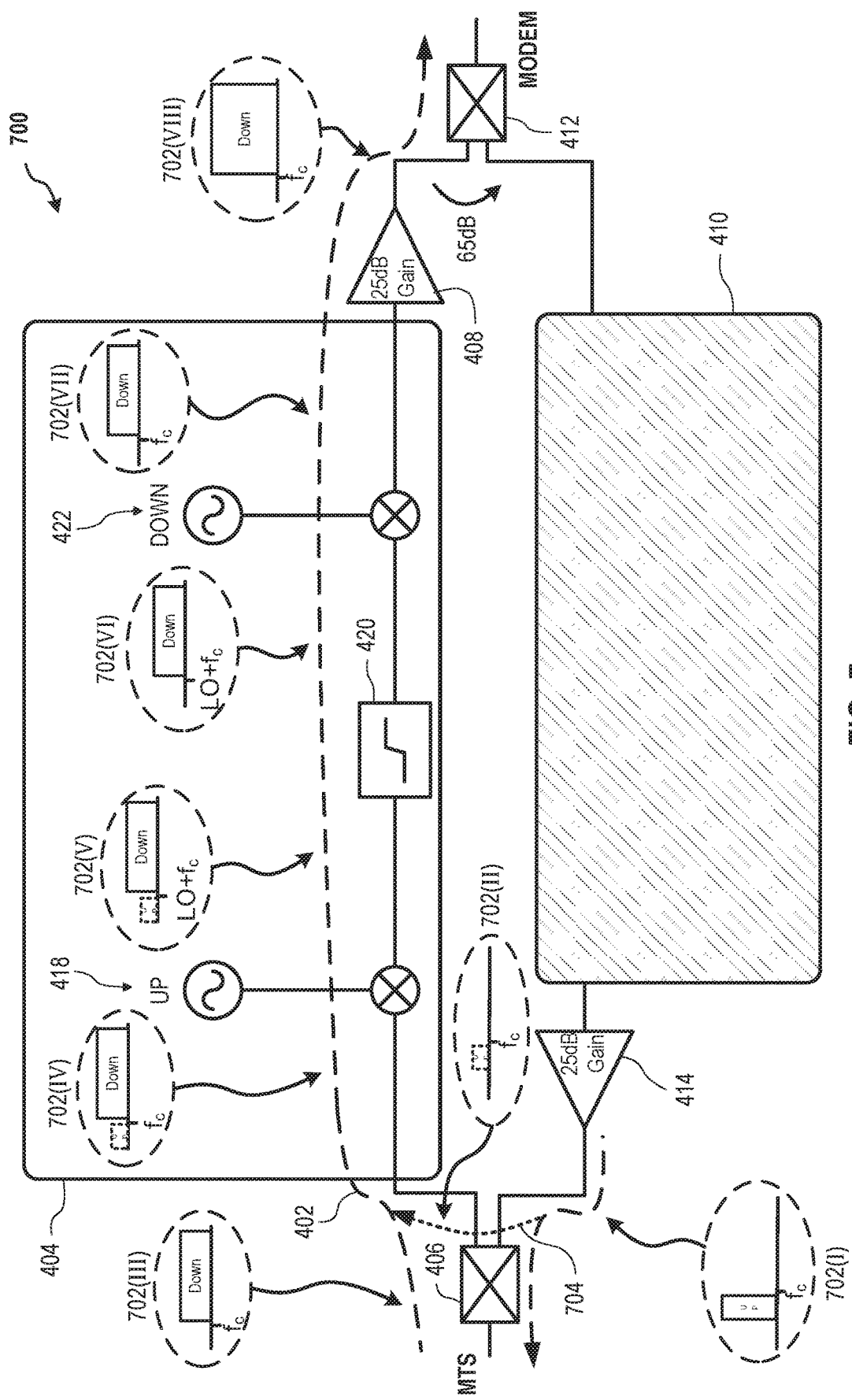
FIG. 7 is a schematic illustration depicting a sequential amplifier bleed-over attenuation effect from the upstream transmission depicted in FIG. 5 onto the downstream transmission depicted in FIG. 4, implementing the full duplex amplification subsystem depicted in FIGS. 4 and 5.

FIG. 7 is a schematic illustration depicting a sequential amplifier bleed-over attenuation effect 700 from upstream transmission 502, FIG. 5, onto downstream transmission 402, FIG. 4, implementing full duplex amplification subsystem 400. Attenuation effect 700 operates in a similar manner to attenuation effect 600, and includes sequence steps 702 executed with respect to a bleed-over 704 from upstream transmission 502 onto downstream transmission 402. That is, amplification subsystem 400 implementing attenuation effect 700 performs a similar operation as that described above with respect to attenuation effect 600, but to remove the undesired upstream bleed-over signal from downstream transmission 402 prior to amplification by downstream amplifier 408.

Therefore, at sequence step 702(I), an amplified upstream signal (e.g., second spectral portion 104, FIG. 1, after passing through upstream amplifier 414) is output from upstream conversion unit 410 for transmission to the MTS. However, at sequence step 702(11), bleed-over 704 causes a portion of the upstream signal to bleed over onto downstream transmission 402 proximate first splitter/combiner 406. At the same time, at sequence step 702(111), a downstream signal (e.g., first spectral portion 102, FIG. 1) is also received at first splitter/combiner 406, thereby forming, at sequence step 702(IV), a combined signal at the input of downstream conversion unit 404 that includes the desired downstream spectral portion from the MTS and the undesired bleed-over upstream spectral portion.

At sequence step 702(V), downstream up-converter 418 is configured to extract the LO from the input downstream transmission 402, and then step up the center frequency $f_c$ of the full duplex transmission such that an up-converted center frequency $f_c'$ that is input to downstream filter 420 is centered at a frequency corresponding to the LO plus the original center frequency $f_c$ of the full duplex transmission spectrum (e.g., a frequency spectrum outside of the typical DOCSIS domain frequency spectrum). Downstream filter 420 may then be set to filter out the undesired upstream bleed-over portion of up-converted downstream transmission 402 prior to amplification by downstream amplifier 408.

In the exemplary embodiment, at sequence step 702(VI), downstream filter 420 is configured to filter out (e.g., a high pass filter (HPF)) the upstream portion of the signal that is in a lower spectral band than the downstream portion, and only the downstream portion of the up-converted downstream transmission 402 is provided to downstream down-converter 422 to shift back to the original full duplex center frequency. At sequence step 702(VII), downstream transmission 402 inputs a "clean" downstream signal (e.g., first spectral portion 102, FIG. 1) to downstream amplifier 408. At sequence step 702(VIII), a "clean" amplified downstream signal is provided to second splitter/combiner 412 for reception by the modem(s). According to the exemplary embodiments depicted in FIGS. 6 and 7, undesirable spectral portions of the opposite-direction transmission are removed from each respective transmission prior to its individual amplification, thereby advantageously removing the instability problem experienced by the conventional full duplex amplification attempts.

FIG. 8 is a schematic illustration of a full duplex amplification subsystem 800 for a communication system. Amplification subsystem 800 is similar in some structural respects to amplification subsystem 400, FIG. 4, and is disposed between an MTS and one or more modems simultaneously operating a downstream transmission portion 802 from the MTS and an upstream transmission portion 804 from the modem(s) over an entire full duplex bandwidth spectrum (e.g., frequency spectrum 100, FIG. 1). In the exemplary embodiment, amplification subsystem 800 includes a downstream amplifier 806, an upstream amplifier 808, a downstream switch unit 810, and an upstream switch unit 812. In an embodiment, downstream switch unit 810 includes a downstream input switch 814, a downstream HPF 816, and an optional downstream LPF 818. Similarly, upstream switch unit 812 includes an upstream input switch 820, and upstream LPF 822 and an optional HPF 824.

In exemplary operation, amplification subsystem 800 includes a sensor 826 configured to extract an LO from either downstream transmission 802 or upstream transmission portion 804, and filter out the respective undesired bleed-over portion of the signal from the other direction prior to amplification by downstream amplifier 806 or upstream amplifier 808, similar to the techniques described above with respect to FIGS. 4-6. That is, amplification subsystem 800 may be configured to determine, from sensor 826, the operation of upstream transmission portion 804 and alert downstream switch unit 810 to cause downstream input switch 814 to implement downstream HPF 816 to filter out the undesired upstream bleed-over signal. In a similar manner, upstream switch unit 812 may also be alerted to implement upstream LPF 822 to filter out the undesired downstream bleed-over signal.

In an exemplary embodiment, a first splitter/combiner $828_D$ and a second splitter/combiner $828_U$ are provided, and may additionally include high isolation to render additional up/down-conversion unnecessary prior to amplification. In an alternative embodiment, conversion units may also be implemented prior to amplification, as described above.

In at least one embodiment, downstream switch unit 810 and upstream switch unit 824 are the same unit, and downstream LPF 818 is upstream LPF 822 and upstream HPF 824 is downstream HPF 816. In this configuration, the single switch unit 810/812 is configured such that downstream input switch 814 also functions as an upstream output switch, while upstream input switch 820 performs a similar dual-function as a downstream output switch. Where switch units 810, 812 are separate units, optional downstream LPF 818 and optional upstream HPF 824 may not to be provided.

In further exemplary operation of amplification subsystem 800, triggering of switches 814, 820 may be according to at least one of: (i) detection of a tone or pattern by sensor 826 from the upstream direction, for example, where the detected tone/pattern is specific to sensor 826, and flips amplification subsystem 800 to pass upstream transmission portion 804 and filter out downstream transmission portion 802; (ii) sensing by sensor 826 of upstream transmission portion 804 within a predetermined frequency range; (iii) scheduling by the MTS (or modem, if desired); and (iv) detection of a tone/pattern from the downstream direction, also specific to sensor 826, to flip amplification subsystem to pass either of downstream transmission 802 and upstream transmission portion 804 depending on a design choice.

FIG. 9 is a schematic illustration of a full duplex amplification subsystem 900 for a communication system. Amplification subsystem 900 is similar to amplification subsystem 800, FIG. 8, and is disposed between an MTS and one or more modems simultaneously operating a downstream transmission portion 902 from the MTS and an upstream transmission portion 904 from the modem(s) over an entire full duplex bandwidth spectrum (e.g., frequency spectrum 100, FIG. 1). In the exemplary embodiment, amplification subsystem 900 includes a downstream amplifier 906, an upstream amplifier 908, a first switch matrix 910 (e.g., 2×2), a second switch matrix 912 (e.g., 2×2), and a HPF 914 and an LPF 916 disposed between first and second switch matrices 910, 912. In an embodiment, amplification subsystem 900 further includes a first sensor 918 and a second sensor 920 configured to extract LO and other sensing information from downstream transmission portion 902 and upstream transmission portion 904. In some embodiments, first and second sensor is 918, 920 may be configured as a single sensor. In an embodiment, amplification subsystem 900 further includes a first splitter/combiner 922 and a second splitter/combiner 924, which may be similar in construction and function to first splitter/combiner $828_D$ and second splitter/combiner $828_U$, respectively. Except for the relative architectural difference provided by switch matrices 910, 912, amplification subsystem 900 operates similarly to amplification subsystem 800.

Figure 10:
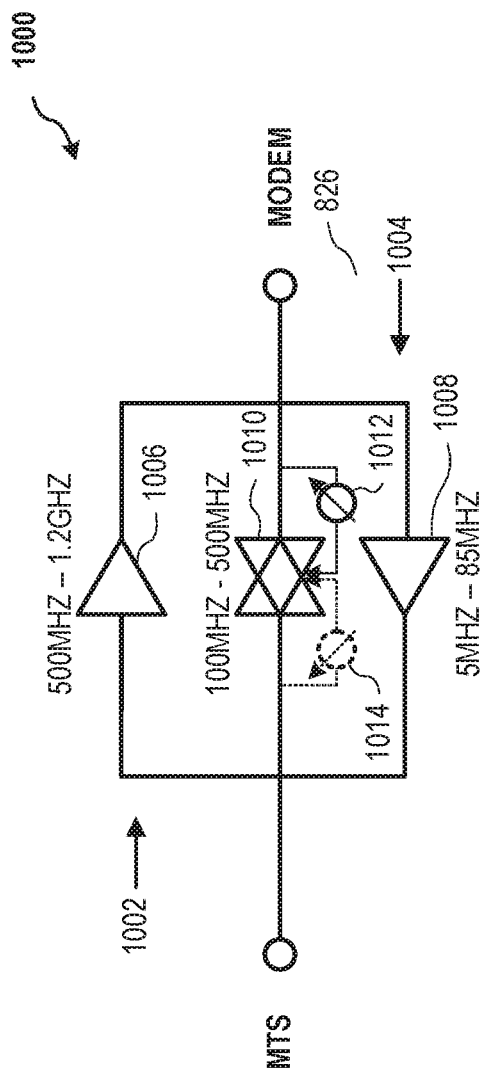
FIG. 10 is a schematic illustration of a hybrid full duplex amplification subsystem for a communication system, in accordance with an embodiment.

FIG. 10 is a schematic illustration of a hybrid full duplex amplification subsystem for a communication system. Amplification subsystem 1000 is functionally similar to amplification subsystem 800, FIG. 8, and amplification subsystem 900, FIG. 9, and is disposed between an MTS and one or more modems simultaneously operating a downstream transmission portion 1002 from the MTS and an upstream transmission portion 1004 from the modem(s) over an entire full duplex bandwidth spectrum (e.g., frequency spectrum 100, FIG. 1). In an exemplary embodiment, amplification subsystem 1000 also similarly includes a downstream amplifier 1006 and an upstream amplifier 1008.

Amplification subsystem 1000 though, differs from the embodiments described above in that, a bi-directional amplifier 1010 is implemented instead of the conversion units and switching architectures described above. In exemplary operation, amplification subsystem 1000 is configured to always transmit a selected higher-band frequency spectrum along the downstream path of downstream transmission portion 1002 through downstream amplifier 1006 (500 MHz-1.2 GHz, in this example) and always transmit a selected lower-band frequency spectrum along the upstream path of upstream transmission portion 1004 through upstream amplifier 1008. A mid-band spectrum (100 MHz-500 MHz, in this example) may then be selectively transmitted upstream or downstream by bi-directional amplifier 1010 according to a detected upstream tone or pattern by an upstream sensor 1012, or a similar detection of a downstream tone/pattern by a downstream detector 1014. In this respect, amplification subsystem 1000 represents a hybrid of the embodiments described above, and is sometimes referred to as a "pseudo-duplex amplifier."

In the exemplary embodiment, bi-directional amplifier 1010 operates in parallel to downstream amplifier 1006 and upstream amplifier 1008. In some embodiments, bi-directional amplifier 1010 may be configured to default to always transmit the mid-band spectrum in the downstream direction, unless sensor 1012 detects an upstream signal within a predetermined range. In at least one embodiment, this predetermined range may be dynamically determined according to operational conditions of the communication network. When an appropriate signal/tone/pattern is detected by sensor 1012 (or sensor 1014, depending on the desired configuration of subsystem 1000), sensor 1012/1014 causes bi-directional amplifier 1010 to flip the transmission direction of the mid-band spectrum. The trigger for flipping bi-directional amplifier 1010 may be according to one or more of: (i) a detected tone/pattern specific to the sensor; (ii) sensing an upstream signal within a predetermined frequency range; (iii) scheduling by the MTS or modem for operation of bi-directional amplifier 1010; (iv) receiving an out-of-band message from the MTS (or modem) to switch direction of the mid-to band transmission; (v) communication by the MTS on a DOCSIS downstream channel to a modem integrated into bi-directional amplifier 1010 to schedule the switch or to change directions; and (vi) a detected sensor-specific tone/pattern triggers sensor 1012 or 1014 from the downstream direction to flip bi-directional amplifier 1010 to operate in either of the upstream or downstream direction according to a predetermined design choice.

Triplexer Bidirectional Amplifier

As described above, full duplex (FDX) bidirectional transmission faces particular challenges due to line loss in the transmissions. These challenges become particularly pronounced with respect to low density neighborhoods, for example, where greater signal amplification may be required. The embodiments described above provide several effective solutions to known challenges to FDX amplification, such as through switching subsystems disposed along the communication paths, and or the addition of a switchable bidirectional mid-band (pseudo-duplex) amplifier. In some cases though, it may be impractical, or not desired, to insert a subsystem into the primary transmission path or add a third amplifier.

Nevertheless, there is a need for FDX amplification of existing legacy transmission systems that seek to increase their data capacity, such as, for example, coaxial cable networks, which are capable of frequencies well above 1800 MHz (i.e., the DOCSIS 3.1 upper specified frequency). Additionally, many new and existing network communication systems now require, or are migrating to, delivery of symmetrical data services with more upstream bandwidth (such as presently occurring in Europe).

Figure 11A:
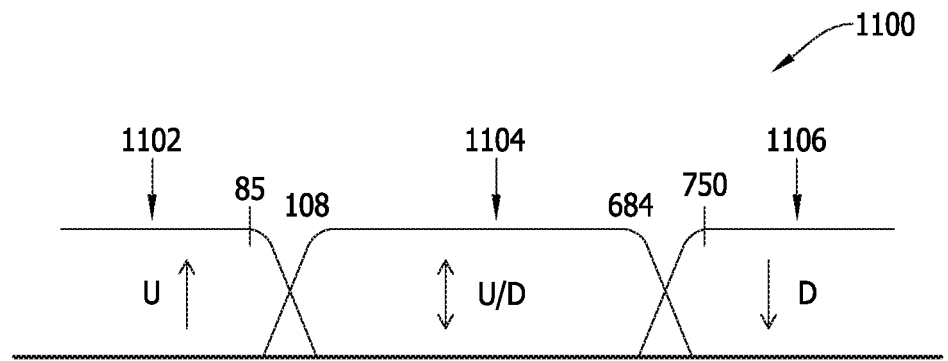
FIG. 11A is a graphical illustration of an alternative apportioned frequency spectrum for dual-direction transmission in a communication system.

FIG. 11A is a graphical illustration of an alternative apportioned frequency spectrum 1100 for dual-direction transmission in a communication system. As illustrated in FIG. 11A, spectrum 1100 includes a first frequency band 1102, a second frequency band 1104 substantially within frequency range higher than that of first frequency band 1102, and a third frequency band 1106 substantially at frequency range higher than that of second frequency band 1104. Accordingly, in this example, first frequency band 1102 is dedicated in carrying upstream propagation signals, third frequency band 1106 is dedicated to carrying downstream propagation signals, and second frequency band 1104 is configured to be substantially in between first frequency band 1102 and third frequency band 1106, and to be capable of carrying signals either upstream or downstream in this mid-band, according to operation of the associated amplification system/subsystem (e.g., described further below with respect to FIG. 11B).

The person of ordinary skill in the art will understand that the particular frequencies and frequency ranges described herein are provided by way of example, and not in a limiting sense. That is, the particular frequency values of the present embodiments are illustrative of the innovative concepts of and advantages realized by the present embodiments. Other frequencies and frequency ranges may be implemented without departing from the scope herein.

In the exemplary embodiment illustrated in FIG. 11A, first frequency band 1102 represents a continuous low upstream band for an amplifier in the range of 5-85 MHz, and third frequency band 1106 represents a continuous high downstream band for an amplifier in the range of 750-1800 MHz. Second frequency band 1104 is thus represented as a switchable mid-band in the range from 108 to 684 MHz, between the respective low and high bands (first and third bands 1102, 1106) on either side. In the example of spectrum 1100 depicted in FIG. 11A, some overlap of bands 1102, 1104, 1106 is shown at the respective side-bands thereof, but the person of ordinary skill in the art will understand that spectrum 1100 may be apportioned such that there is little or no overlap between the low, mid, and high bands.

In the exemplary embodiment, and as explained further below with respect to FIG. 11B, first frequency band 1102 (e.g., 5-85 MHz) is apportioned to always propagate upstream, third frequency band 1106 (e.g., 750-1800 MHz, or higher) is apportioned to always propagate downstream, and second frequency band 1104 (e.g., 108-684 MHz) is apportioned to be capable of amplification either upstream or downstream, on command. An exemplary amplification architecture for realizing apportioned frequency spectrum 1100 in a cost-efficient manner is described further below with respect to FIG. 11B.

Figure 11B:
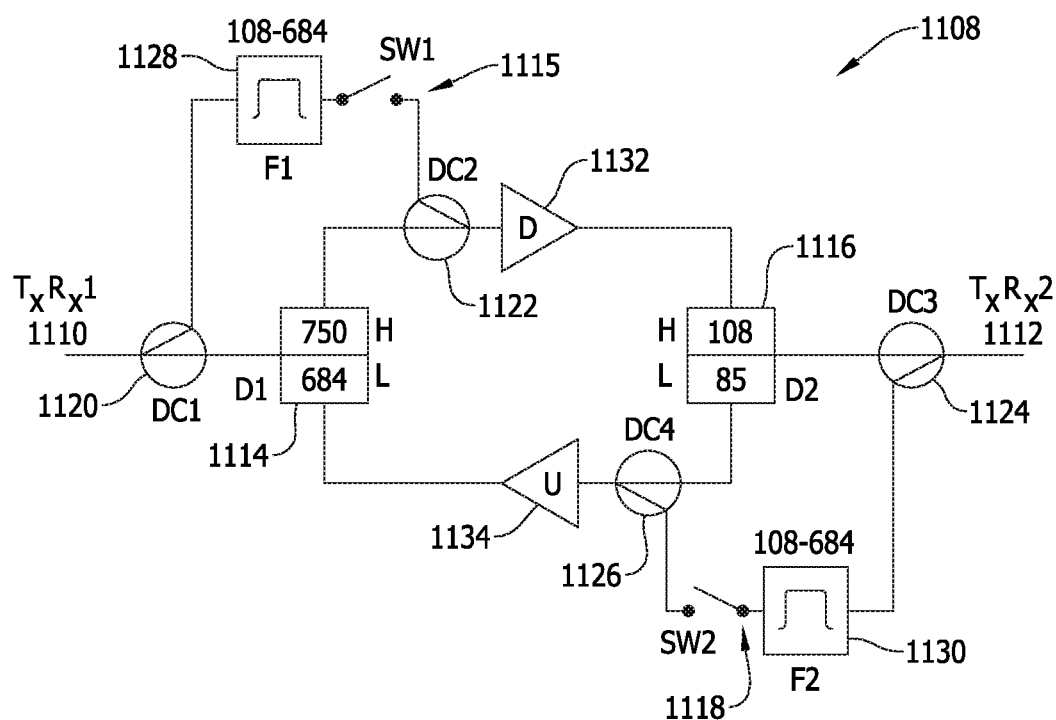
FIG. 11B is a schematic illustration of an alternative full duplex amplification subsystem for a communication system, in accordance with an embodiment.

FIG. 11B is a schematic illustration of an alternative FDX amplification subsystem 1108 for a communication system. In an exemplary embodiment, subsystem 1108 is disposed between a first, "downstream" transceiver 1110 ($T_XR_X1$) and a second, "upstream" transceiver 1112 ($T_XR_X2$). In this example, the terms "downstream" and "upstream" are to be considered illustrative, and not limiting. That is, the respective signal propagation directions are subjectively relative to one another, but not necessarily fixed with respect to external or objective reference points. Accordingly, for this particular example, first transceiver 1110 may represent an MTS (e.g., a CMTS in a hub or headend for a cable plant), and second transceiver 1112 may represent a modem (e.g., a cable modem to a home location).

In the exemplary embodiment, amplification subsystem 1108 includes a first diplexer 1114 (D1) operably coupled with a first switch 1115 (SW1), and a second diplexer 1116 (D2) operably coupled with a second switch 1118 (SW2). First diplexer 1114 and first switch 1115 may therefore be disposed in parallel between a first directional coupler 1120 (DC1) and a second directional coupler 1122 (DC2). Similarly, second diplexer 1116 and second switch 1118 may be disposed in parallel between a third directional coupler 1124 (DC3) and a fourth directional coupler 1126 (DC4). Additionally, a first filter 1128 (F1) is disposed in series with first switch 1115, and a second filter 1130 (F2) is disposed in series with second switch 1118. In the exemplary embodiment, first and second filters 1128, 1130 may, for example, be bandpass filters configured to substantially correspond to the operable mid-band range of second frequency band 1104, FIG. 11A (108-684 MHz, in this example), or range represented by the "high" limit of second diplexer 1116 and the "low" limit of first diplexer 1114. Subsystem 1108 further includes a first amplifier 1132 in the "downstream" transmission path, and a second amplifier 1134 in the "upstream" transmission path.

In exemplary operation of amplification subsystem 1108, first diplexer is configured to have a 684/750 MHz split (i.e., for the illustrative exemplary frequency ranges featured in FIG. 11A), and second diplexer 1116 is configured to have an 85/108 MHz split. First switch 1115 may, when closed, then pass signals in the downstream direction in the range of 108-684 MHz. Similarly, when closed, second switch 1118 may pass signals in the upstream direction in the range of 108-684 MHz. In the exemplary embodiment, and as explained further below with respect to FIGS. 12A-14B, first and second switches 1115, 1118 may remain open as a default configuration (e.g., FIGS. 12A-B), and only one switch may be closed at a given time (e.g., FIGS. 13A-14B). In an embodiment, switches 1115, 1118 may be solid state devices, and configured to have low loss and low distortion, and be capable of switching in microseconds.

In further operation of amplification subsystem 1108, first directional coupler 1120 functions to sample downstream signals from first transceiver 1110, and to provide an input to first filter 1128 (e.g., a 108-684 MHz bandpass filter, in this example). An output of filter 1128 is therefore within the mid-band range of second frequency band 1104, switched by first switch 1115, and then combined, at second directional coupler 1122 when first switch 1115 is closed (and second switch 1118 is open), with the primary downstream signal, namely, the low band signal within first frequency band 1102 for amplification by downstream first amplifier 1132 (described further below with respect to FIGS. 14A-B).

Third directional coupler 1124 functions in a similar manner, but to sample upstream signals from second transceiver 1112 in the case where second switch 1118 is closed, and first switch 1115 is open. The sampled upstream signals are then passed to the input of second filter 1130 (i.e., also a 108-684 MHz bandpass filter, in this example), which outputs an upstream signal within the mid-band for combination, at fourth directional coupler 1126, for upstream amplification by upstream second amplifier 1134 (described further below with respect to FIGS. 13A-B).

In an exemplary embodiment, amplification subsystem 1108 is configured to amplify mid-band signals (e.g., 108-684 MHz, in this example) in either the upstream or downstream signal propagation direction on command. That is, the relevant command (e.g., operation of triggering event and/or sensed signal pattern, described above, specific to switch operation, etc.) functions to control the operation of first and second switches 1115, 1118, and may, for example, be issued by a processor or control unit (not shown) of the MTS to a receiver in the housing (not shown) of the respective remote amplifier. In the exemplary embodiments shown in FIGS. 11A-B, continuous upstream communications may maintained for a population of modems (e.g., second transceivers 1112) in the 5-85 MHz band (e.g., low first frequency band 1102), and downstream communications may be maintained in the 750-1800 MHz band (e.g., high third frequency band 1106).

In at least one embodiment, first and second switches 1115, 1118 are configured as "break before make" type switches, which may be desirable to prevent or reduce potential amplifier oscillation. In an optional embodiment, it may be desirable to dispose one or more low power amplifiers (not shown) in series with either or both of first and second filters 1128, 1130, such that less loss is allowed through the respective directional couplers. That is, in such cases (see FIGS. 13B, 14B, below), additional amplification may be provided in-line with filters 1128, 1130 to overcome the loss from the respective directional couplers 1120, 1122, 1124, 1126. This additional amplification should be configured to result in a low power output because it is not generally expensive to achieve higher gain with an amplifier, but clean high power outputs would be expected to more significantly increase the cost of the subsystem.

In an alternative optional embodiment, amplifiers 1132, 1134 may each be configured as dual-input amplifiers. One of the respective filter inputs (not separately shown) may be connected to the respective filter 1128, 1130 (or switch 1115, 1118) and have higher gain, and the other of the filter inputs (also not shown) may be connected to the respective diplexer and have lower gain. According to this optional alternative embodiment, the need for second directional coupler 1122 and fourth directional coupler 1126 is eliminated.

In some embodiments, second transceivers 1112 may receive commands from first transceiver 1110 to receive or transmit in the mid-band (e.g., 108-684 MHz) at the same time that amplification subsystem 1108 is commanded to change amplification direction of the mid-band (e.g., by opening/closing switches 1115, 1118).

In some embodiments, amplification subsystem 1108 may further include known conventional hardware (e.g., pads, equalizers, trims, power passing chokes, noise blocking switches, etc.) that are not shown in FIG. 11B. In at least one embodiment, first and second switches 1115, 1118 may be statically set to upstream or downstream operation, for example, by manual amplification alignment (e.g., by a technician). In some cases, the switches may further be utilized to troubleshoot upstream legs having noise, including common path distortion (CPD), and/or to block transmission legs that are not transporting signals in the selected mid-band. In the case where amplification subsystem 1108 is implemented with respect to a cable plant, amplification subsystem may be further configured to block ingressing signals below 25 MHz, since the strength of such ingressing signals may significantly use up amplifier dynamic range.

Figure 12A:
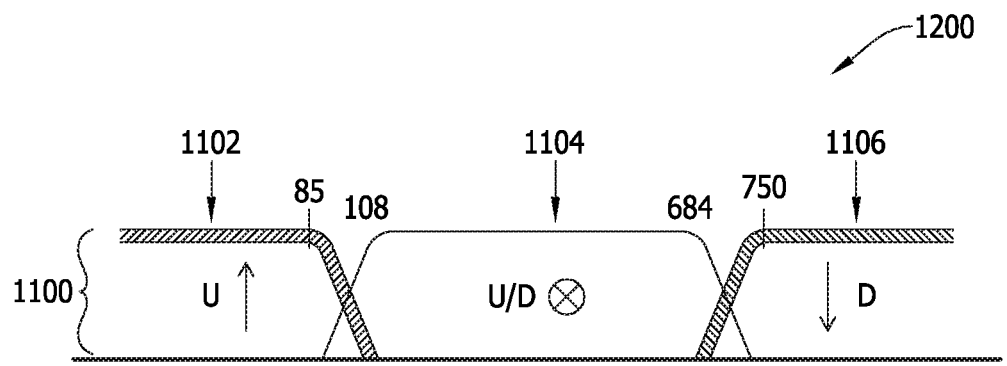
FIG. 12A is a graphical illustration of a frequency plan for the apportioned frequency spectrum depicted in FIG. 11A, in a case where the mid-band is blocked.
Figure 12B:
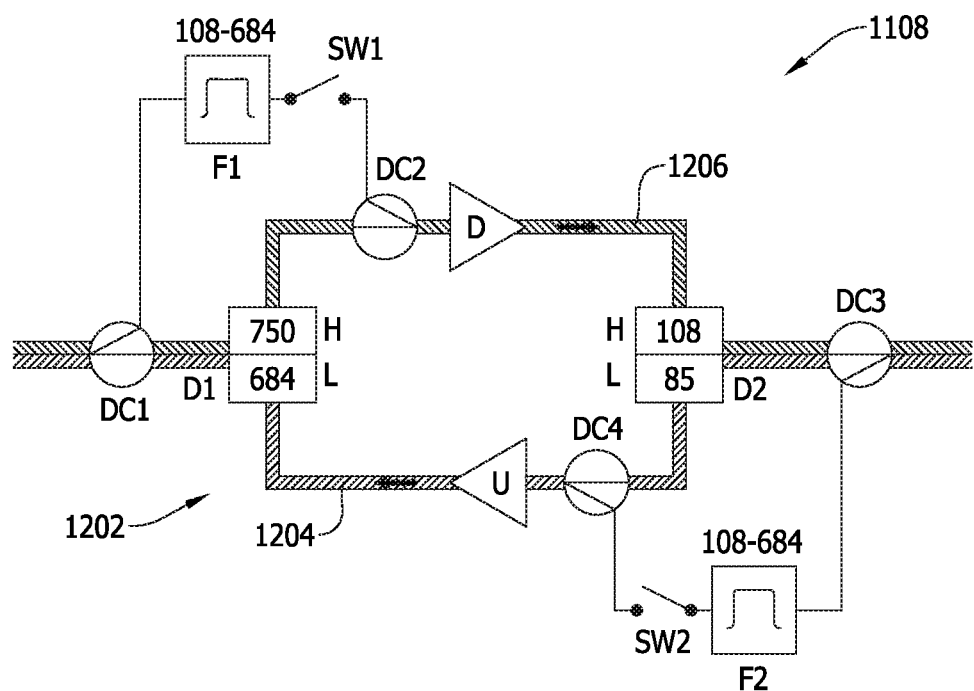
FIG. 12B is a schematic illustration depicting a frequency propagation effect for the full duplex amplification subsystem depicted in FIG. 11B, according to the frequency plan depicted in FIG. 12A.

FIG. 12A is a graphical illustration of a frequency plan 1200 for apportioned frequency spectrum 1100, FIG. 11A, in a case where the mid-band (i.e., second frequency band 1104) is blocked. FIG. 12B is a schematic illustration depicting a frequency propagation effect 1202 for full duplex amplification subsystem 1108, FIG. 11B, according to frequency plan 1200, FIG. 12A. More particularly, frequency plan 1200 may be established when first and second switches 1115, 1118 are opened, for example, as a default position, or in response to a command signal, as described above. With the mid-band blocked, first frequency band 1102 is amplified along upstream transmission path 1204, and third frequency band 1106 is amplified along downstream transmission path 1206. According to this configuration, amplification subsystem 1108 is rendered effectively dormant until one of first and second switches 1115, 1118 is closed to allow mid-band transmission.

Figure 13A:
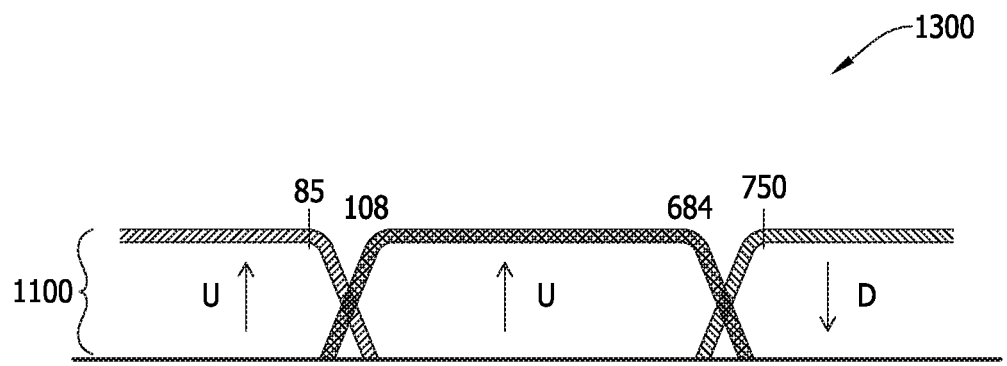
FIG. 13A is a graphical illustration of a frequency plan for the apportioned frequency spectrum depicted in FIG. 11A, in a case of upstream amplification of the mid-band.
Figure 13B:
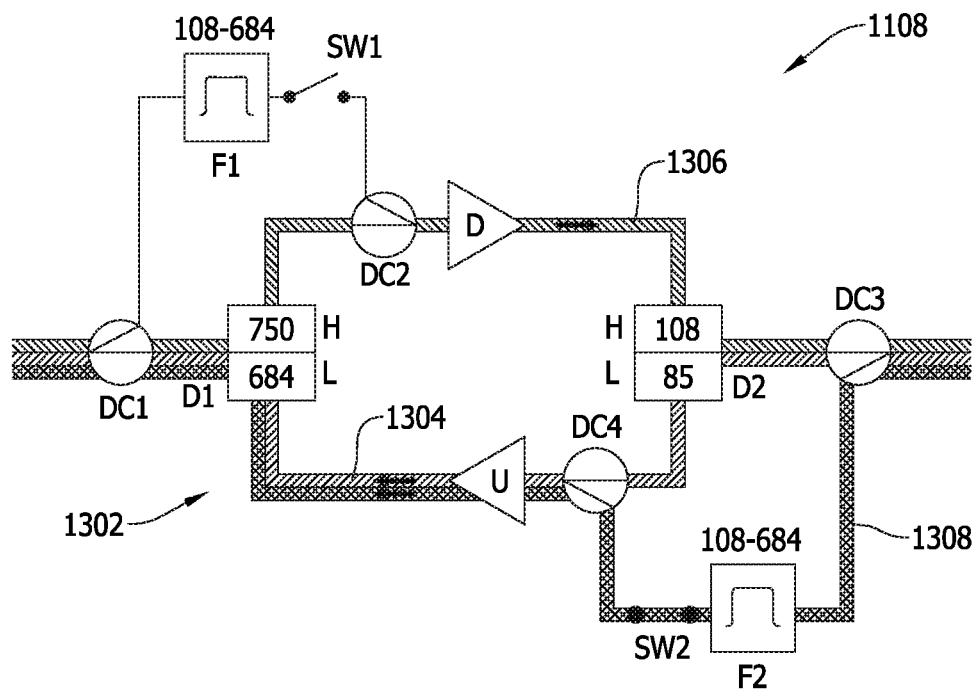
FIG. 13B is a schematic illustration depicting a frequency propagation effect for the full duplex amplification subsystem depicted in FIG. 11B, according to the frequency plan depicted in FIG. 13A.

FIG. 13A is a graphical illustration of a frequency plan 1300 for apportioned frequency spectrum 1100, FIG. 11A, in a case of upstream amplification of mid-band 1104. FIG. 13B is a schematic illustration depicting a frequency propagation effect 1302 for full duplex amplification subsystem 1108, FIG. 11B, according to frequency plan 1300, FIG. 13A. More particularly, frequency plan 1300 is established upon receipt of a command to open first switch 1115 and close second switch 1118. In the operational configuration of frequency propagation effect 1302, first frequency band 1102 remains amplified along upstream transmission path 1304 and third frequency band 1106 remains amplified along downstream transmission path 1306. However, the opening of first switch 1115 and closing of second switch 1118 allows upstream propagation of the mid-band of second frequency spectrum 1104 along upstream bypass path 1308.

Upstream bypass path 1308 represents an upstream bypass route for the mid-band, between third directional coupler 1124 and fourth directional coupler 1126 through second filter 1130, thereby allowing upstream propagation of the mid-band that is otherwise blocked by operation of second diplexer 1116. In contrast, operation of first diplexer 1114 blocks downstream propagation of the mid-band, with no downstream bypass route available due to opened first switch 1115.

Figure 14A:
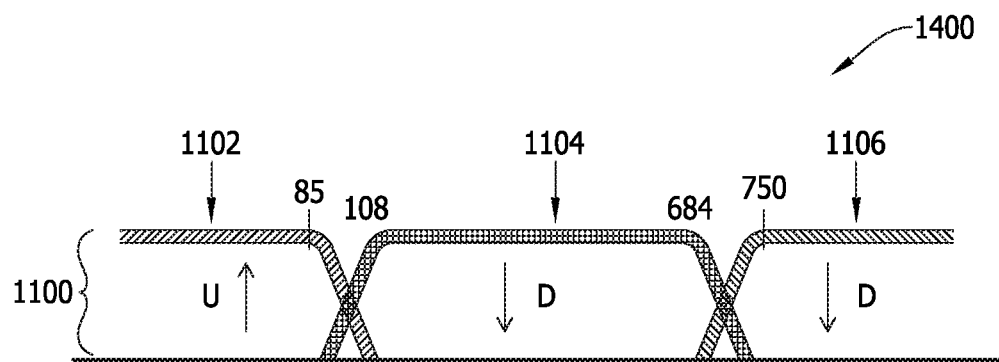
FIG. 14A is a graphical illustration of a frequency plan for the apportioned frequency spectrum depicted in FIG. 11A, in a case of downstream amplification of the mid-band.
Figure 14B:
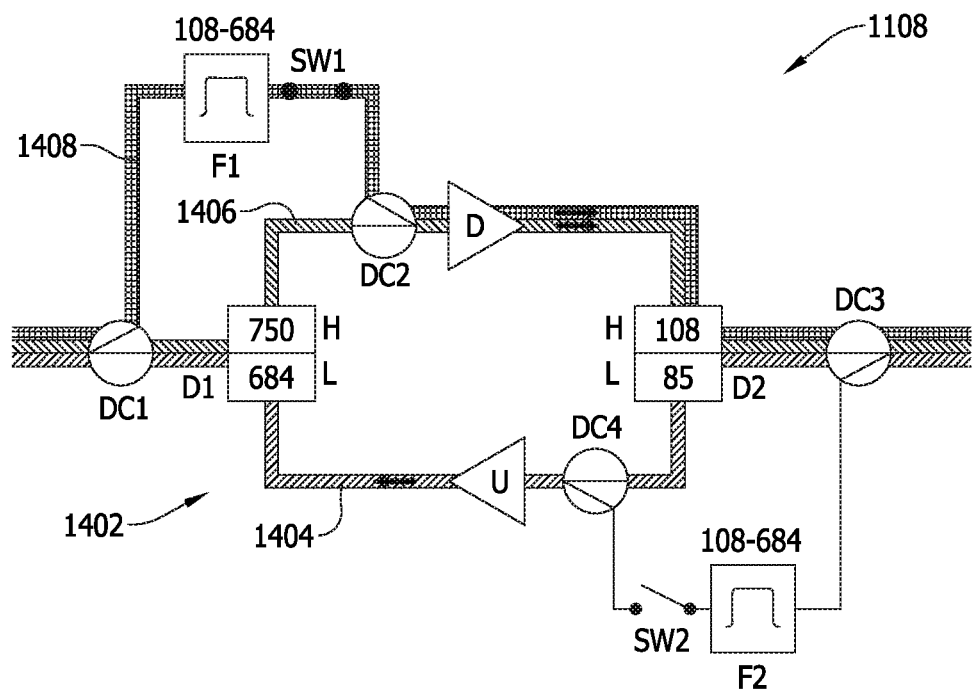
FIG. 14B is a schematic illustration depicting a frequency propagation effect for the full duplex amplification subsystem depicted in FIG. 11B, according to the frequency plan depicted in FIG. 14A.

FIG. 14A is a graphical illustration of a frequency plan 1400 for apportioned frequency spectrum 1100, FIG. 11A, in a case of downstream amplification of mid-band 1104. FIG. 14B is a schematic illustration depicting a frequency propagation effect 1402, for full duplex amplification subsystem 1108, FIG. 11B, according to frequency plan 1400, FIG. 14A. More particularly, frequency plan 1400 is established upon receipt of a command to close first switch 1115 and open second switch 1118 (i.e., the opposite configuration to frequency propagation effect 1302).

In the operational configuration of frequency propagation effect 1402, first frequency band 1102 remains amplified along upstream transmission path 1404 and third frequency band 1106 remains amplified along downstream transmission path 1406. However, the closing of first switch 1115 and opening of second switch 1118 allows downstream propagation of the mid-band of second frequency spectrum 1104 along downstream bypass path 1408. Downstream bypass path 1408 represents a downstream bypass route for the mid-band, between first directional coupler 1120 and second directional coupler 1122 through first filter 1128, thereby allowing downstream propagation of the mid-band that is otherwise blocked by operation of first diplexer 1114. In contrast, operation of second diplexer 1116 still blocks upstream propagation of the mid-band, but now without an upstream bypass route available due to the closing of second switch 1118.

According to the innovative configuration and operation of amplification subsystem 1108, the amplification techniques of propagation effects 1202, 1302, 1402 may be accomplished through a simplified architecture that successfully reduces the number of needed amplifier elements, filters, switches, and related hardware components. This reduced hardware complexity advantageously increases the reliability of the amplification system or apparatus, while reducing the structural cost thereof and the operational power consumption thereby. Systems and methods according to the present embodiments are particularly useful for implementation with existing transmission networks where it may not be desirable to add filters, switches, or other hardware within the legacy transmission pathways, other than connection to the respective directional couplers, and operation of a switch controller (not shown) capable of receiving commands from first transceiver 1110 (and/or second transceiver 1112).

According to these exemplary embodiments, the present systems and methods are further advantageously capable of receiving proactive network maintenance (PNM) data for the amplifier as a whole, and the MTS it is enabled to instruct the modem(s) to actually change to frequency ranges on any of the amplifiers.

The present embodiments are described above with respect to several components of a conventional cable and/or wireless/Wi-Fi networks. Optical networks though, are also contemplated within the scope of the present embodiments. Such optical networks may include, without limitation, components such as an Optical Network Terminal (ONT) or Optical Line Termination (OLT), and an Optical Network Unit (ONU), and may utilize optical protocols such as EPON, RFoG, or GPON. Other types of communication systems our further contemplated, including communication systems capable of x-hauling traffic, satellite operator communication systems, MIMO communication systems, microwave communication systems, short and long haul coherent optic systems, etc.

X-hauling is defined herein as any one of or a combination of front-hauling, backhauling, and mid-hauling. In these additional embodiments, the MTS may include, without limitation, a termination unit such as an ONT, an OLT, a Network Termination Unit, a Satellite Termination Unit, a Cable MTS (CMTS), or other termination systems collectively referred to herein as "Modem Termination Systems" or an "MTS". Similarly, the modem described above may include, without limitation, a cable modem (CM), a satellite modem, an Optical Network Unit (ONU), a DSL unit, etc., which are collectively referred to herein as "modems." Furthermore, the DOCSIS protocol may be substituted with, or further include protocols such as EPON, RFoG, GPON, Satellite Internet Protocol, without departing from the scope of the embodiments herein.

Exemplary embodiments of systems and methods for amplification of a full duplex transmission are described above in detail. The systems and methods of this disclosure though, are not limited to only the specific embodiments described herein, but rather, the components and/or steps of their implementation may be utilized independently and separately from other components and/or steps described herein.

Although specific features of various embodiments of the disclosure may be shown in some drawings and not in others, this convention is for convenience purposes and ease of description only. In accordance with the principles of the disclosure, a particular feature shown in a drawing may be referenced and/or claimed in combination with features of the other drawings.

Some embodiments involve the use of one or more electronic or computing devices. Such devices typically include a processor or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a digital signal processing (DSP) device, and/or any other circuit or processor capable of executing the functions described herein. The processes described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term "processor."

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. An amplification subsystem for amplifying signals traveling between first and second transceivers in a communication system, comprising:
a first amplifier configured to amplify first signals traveling from the first transceiver to the second transceiver;
a second amplifier configured to amplify second signals traveling from the second transceiver to the first transceiver; and
circuitry configured to:
propagate the first signals, within a first frequency band, to the first amplifier,
selectively propagate the first signals, within a second frequency band that is different from the first frequency band, to the first amplifier,
propagate the second signals, within a third frequency band, to the second amplifier, and
selectively propagate the second signals, within a fourth frequency band that is different from the third frequency band, to the second amplifier.

2. The amplification subsystem of claim 1, wherein the fourth frequency band is the same as the second frequency band.

3. The amplification subsystem of claim 1, wherein each of the second and fourth frequency bands is between (a) the first frequency band and (b) the third frequency band.

4. The amplification subsystem of claim 3, wherein:
the first frequency band partially overlaps each of the second and fourth frequency bands; and
the third frequency band partially overlaps each of the second and fourth frequency bands.

5. The amplification subsystem of claim 4, wherein the first frequency band does not overlap the third frequency band.

6. The amplification subsystem of claim 1, wherein the circuitry comprises a first coupler configured to combine (a) the first signals within the first frequency band and (b) the first signals within the second frequency band, before an input to the first amplifier.

7. The amplification subsystem of claim 6, wherein the circuitry further comprises a second coupler configured to combine (a) the second signals within the third frequency band and (b) the second signals within the fourth frequency band, before an input to the second amplifier.

8. The amplification subsystem of claim 1, wherein the first amplifier is configured to receive (a) the first signals within the first frequency band and (b) the first signals within the second frequency band, in parallel.

9. The amplification subsystem of claim 1, wherein the circuitry comprises a first bandpass filter configured to propagate the first signals within the second frequency band, to the first amplifier.

10. The amplification subsystem of claim 9, wherein the circuitry further comprises a first switch communicatively coupled in series with the first bandpass filter, wherein the first switch is operable to selectively enable propagation of the first signals, within the second frequency band, to the first amplifier.

11. The amplification subsystem of claim 10, wherein the circuitry further comprises a second bandpass filter configured to propagate the second signals within the fourth frequency band, to the second amplifier.

12. The amplification subsystem of claim 11, wherein the circuitry further comprises a second switch communicatively coupled in series with the second bandpass filter, wherein the second switch is operable to selectively enable propagation of the second signals, within the fourth frequency band, to the second amplifier.

13. The amplification subsystem of claim 1, wherein the circuitry comprises a first diplexer configured to (a) propagate the first signals, within the first frequency band, to the first amplifier and (b) propagate the second signals, within each of the third and fourth frequency bands, to the first transceiver.

14. The amplification subsystem of claim 13, wherein the circuitry further comprises a second diplexer configured to (a) propagate the second signals, within the third frequency band, to the second amplifier and (b) propagate the first signals, within each of the first and second frequency bands, to the second transceiver.

15. The amplification subsystem of claim 14, wherein each of the first diplexer and the second diplexer have different respective frequency splits.

16. A method for amplifying signals in a communication system, comprising:
propagating downlink signals, within a first frequency band, to a first amplifier for amplification;
selectively propagating downlink signals, within a second frequency band that is different from the first frequency band, to the first amplifier for amplification;
propagating uplink signals, within a third frequency band, to a second amplifier for amplification; and
selectively propagating uplink signals, within a fourth frequency band that is different from the third frequency band, to the second amplifier for amplification.

17. The method of claim 16, wherein:
selectively propagating downlink signals, within the second frequency band, to the first amplifier comprises controlling a first switch communicatively coupled in series with a first bandpass filter, the first bandpass filter having bandpass characteristics aligned with the second frequency band; and
selectively propagating uplink signals, within the fourth frequency band, to the second amplifier comprises controlling a second switch communicatively coupled in series with a second bandpass filter, the second bandpass filter having bandpass characteristics aligned with the fourth frequency band.

18. The method of claim 16, wherein the fourth frequency band is the same as the second frequency band.

19. The method of claim 16, wherein each of the second and fourth frequency bands is between (a) the first frequency band and (b) the third frequency band.

20. The method of claim 19, wherein:
the first frequency band partially overlaps each of the second and fourth frequency bands;
the third frequency band partially overlaps each of the second and fourth frequency bands; and
the first frequency band does not overlap the third frequency band.

* * * * *